US006191664B1

(12) United States Patent
Fiedziuszko et al.

(10) Patent No.: US 6,191,664 B1
(45) Date of Patent: Feb. 20, 2001

(54) MICROWAVE MULTIPLEXER WITH TUNABLE MANIFOLD AND METHOD OF ADJUSTMENT

(75) Inventors: Slawomir J. Fiedziuszko, Palo Alto; David J. Dunker, Fremont, both of CA (US)

(73) Assignee: Space Systems/Loral, Inc., Palo Alto, CA (US)

( * ) Notice: Under 35 U.S.C. 154(b), the term of this patent shall be extended for 0 days.

(21) Appl. No.: 09/317,337

(22) Filed: May 24, 1999

(51) Int. Cl.$^{7}$ .............................. H03H 7/46; H03H 7/38; H04J 1/08; H01P 1/213; H01P 3/123

(52) U.S. Cl. ............................ 333/126; 333/135; 333/33; 333/239; 333/253; 333/209

(58) Field of Search .................................... 333/126, 135, 333/33, 231–233, 239, 248, 253, 99 R, 202, 208, 209

(56) References Cited

U.S. PATENT DOCUMENTS 2,563,612 * 8/1951 Nebel .................................. 333/239
3,974,467 * 8/1976 Tobita et al. ..................... 333/248 X
4,200,847 * 4/1980 Nishikawa et al. .................. 333/125
4,614,920 * 9/1986 Tong .................................... 333/135
4,780,693 * 10/1988 Elliott et al. ......................... 333/135
5,977,849 * 11/1999 Hsing et al. ......................... 333/232

FOREIGN PATENT DOCUMENTS

1015990 * 10/1952 (FR) .................................... 333/231

* cited by examiner

*Primary Examiner*—Benny Lee
*Assistant Examiner*—Barbara Summons
(74) *Attorney, Agent, or Firm*—Perman & Green, LLP

(57) ABSTRACT

A manifold is constructed with a primary manifold section to which the input wave guides are connected and a tuning section attached to the output of the primary manifold section. The tuning section is constructed of a deformable material which allows the dimpling of the internal wall to alter the impedance of the waveguide system for the purpose of fine tuning the impedance matching of the manifold.

10 Claims, 3 Drawing Sheets

MICROWAVE MULTIPLEXER WITH TUNABLE MANIFOLD AND METHOD OF ADJUSTMENT

BACKGROUND OF THE INVENTION

It is now prevalent in satellite microwave communications systems for the such systems to process multiple channels. This requires the combination or separation of the channels either for transmission or for processing after acquisition. This function is usually accomplished by means of a multiplexer. The typical multiplexer consists of a series of input waveguides generally including filter elements connected to a waveguide manifold through ports or irises. Each of the filters is tuned and the irises designed for maximum efficiency of the overall system.

In order to obtain optimum performance of the multiplexer, while minimizing losses, the internal impedance of the various components must be closely matched. This process of tuning the system requires the balancing of hundreds of variables many of which are extremely sensitive because of the high frequency environment. The design of these components has, therefore, become a difficult technological challenge. Although the optimization problem can be diminished through the use of various design techniques, because of the inherent limitations of manufacturing tolerances, the design of the these components ultimately relies on a trial and error process in which multiplexers are constructed, tested, modified, tested and gradually optimized in this manner. There are limits however, to the number of iterations which can be employed with constructive results.

It is a purpose of this invention to provide a multiplexer system and method of adjustment that allows a final adjustment of the impedance of the manifold to tune the overall system.

One means in the prior art for providing a final tuning step involves the insertion of tuning screws extending through the structure of the microwave filters, as shown in U.S. Pat. No. 4,614,920. A series of holes are drilled through the outer wall of the filter and screws are screwed in place to create adjustable perturbations on the inner surface of the associated filter waveguide cavity. This adjusting screw method, when applied to a tuning section as constructed in the manifold of this invention, creates undesirable reduction of power handling and contact problems leading to is possible generation of passive inter-modulation products (PIMS).

A waveguide system using a threaded rod protruding into a waveguide cavity for the purpose of fine tuning the impedance matching adjustment of the waveguide is shown in U.S. Pat. No. 4,200,847. This configuration also creates undesirable power handling and PIMS conditions.

It is a purpose of this invention to simulate the protrusions of the tuning screw without the need to fracture the wall of the waveguide and thereby avoid these problems.

SUMMARY OF THE INVENTION

The manifold of this invention is constructed with a primary manifold section to which the input wave guides, including filters, are connected and a tuning section attached to the output of the primary manifold section. The tuning section is constructed of a deformable material which allows the dimpling of the internal wall to alter the impedance of the waveguide system. The dimpling may be accomplished by an adjustable clamp or appropriate crimping tool which allows a controlled force to be exerted by the tool. The final adjustment is accomplished by monitoring the performance as dimples are constructed at various positions in the broad wall of the tuning section of the manifold.

DESCRIPTION OF THE DRAWING

The invention is described in more detail below with reference to the attached drawing in which.

DESCRIPTION OF THE PREFERRED EMBODIMENT

The system of this invention is constructed for use in a satellite communications network in which multiple channels are required. In the process of receiving and transmitting microwave signals, either at a ground station or on board an orbiting satellite, it is necessary to combine or separate the communication channels before further processing. This task is accomplished by means of a multiplexer. For illustration purposes an output multiplexer 1 is described with particular reference to FIG. 1. In this particular application the channeled output of the multiplexer 1 is fed to an antenna for transmission to a ground station. Since it is intended for use onboard a satellite, weight is a primary consideration. In addition the system must be accurately tuned because there is no opportunity for further correction after it is in orbit.

Figure 1A:
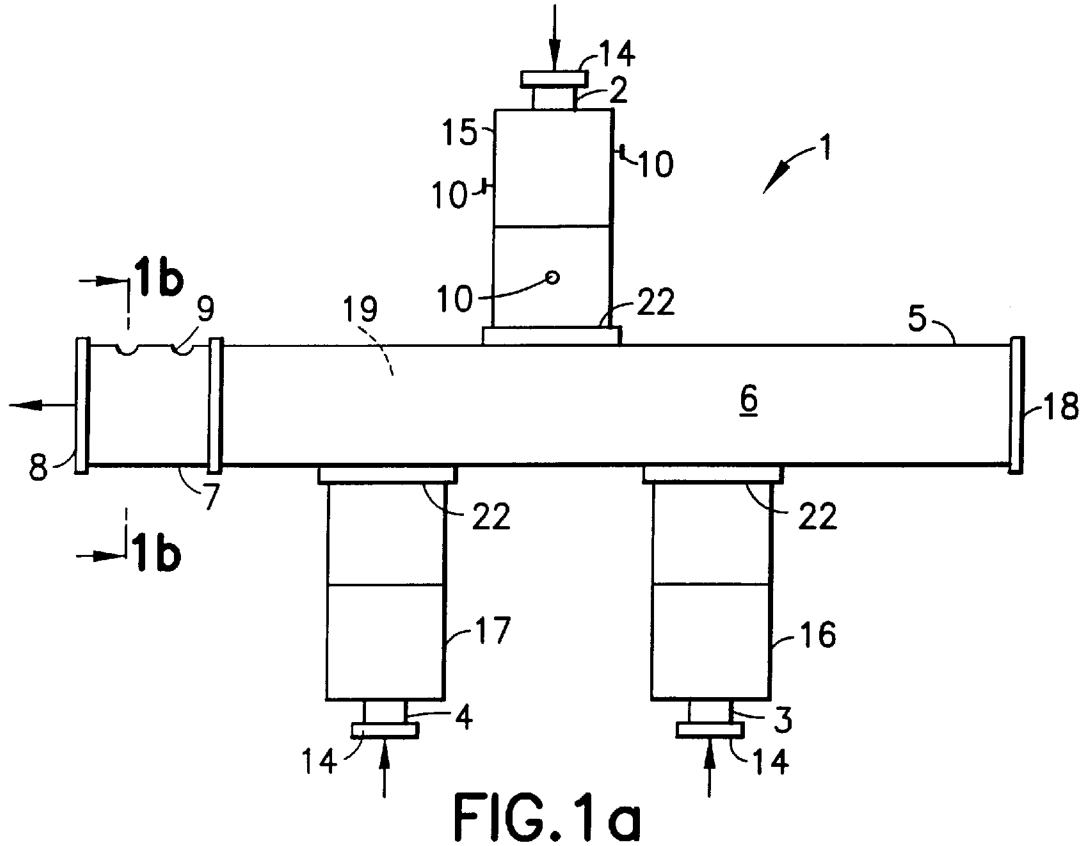
FIG. 1*a* is a schematic diagram of the multiplexer of this invention.

The multiplexer 1 is an assembly of several waveguides 2–4 with waveguide cavity filters 15–17 which are coupled to the manifold 5, as shown in FIG. 1. Each of the input waveguides 2–4 receives microwave signals through an input port 14 and are coupled to the manifold 5 by an appropriate coupling mechanism 22, as is known in the art. The waveguides 2–4 will generally be coupled through filters 15, 16 and 17.

The manifold 5 is constructed in two sections, namely, a primary section 6 and a tuning section 7. The primary section has shorting cap 18 at one end and an output 8 at the other end. The primary section may be constructed of an appropriate light weight, high strength material having the necessary conductivity characteristics such as silver plated carbon reinforced composite or a temperature stable alloy such as is sold under the trademark INVAR.

Figure 1B:
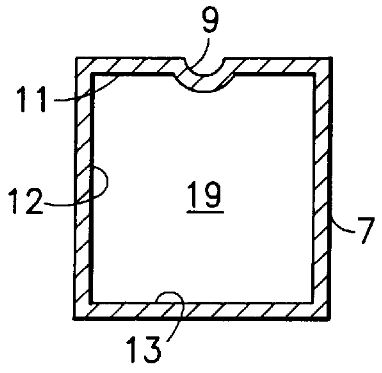
FIG. 1*b* is a cross sectional view taken along section line 1*b*–1*b* in FIG. 1*a,* of the tuning section of this invention.
Figure 1C:
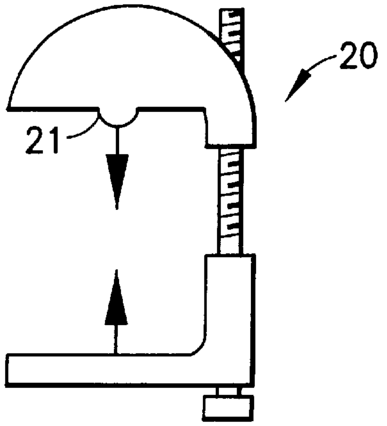
FIG. 1*c* is a crimping tool for deforming the wall of the tuning section of the invention.

The tuning section 7 is coupled to the primary section 6 to provide a continuous manifold cavity 19 having a uniform interior contour. In general the manifold is constructed with a rectangular cross section having a broad wall 11 at the top, side walls 12, and a bottom wall 13 as shown in FIG. 1*b*. In accordance with this invention the tuning section is constructed of a permanently deformable material, such as thin walled aluminum.

The overall system 1 of this invention is tuned to optimize the performance of the multiplexer while minimizing losses. The design is performed taking into consideration the many variables in accordance with the trial and error practices currently in use. As a final tuning step, the tuning section is gripped by a crimping toot 20 shown in FIG. 1*c,* which engages the broad wall 11. The engagement surface 21 of the tool 20 comprises a semi-cylindrical mandrel which, upon the exertion of an appropriate force forms a dimple 9 from the exterior inward. As shown in FIG. 1*b,* this creates a protrusion 9 in the broad wail 11 which extends into manifold cavity 19.

Figure 2:
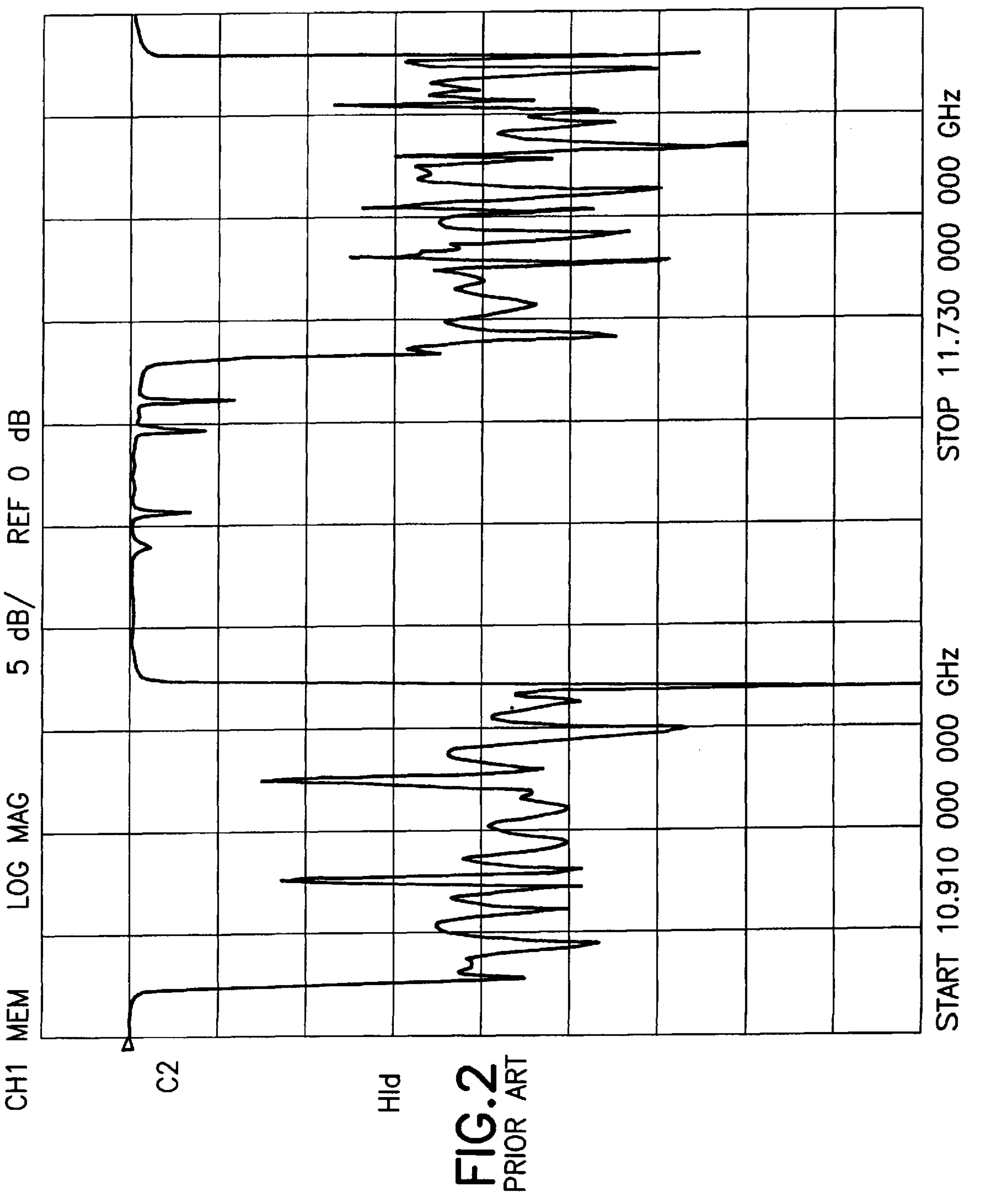
FIG.2 PRIOR ART
FIG. 2 is a graph showing the return loss of a system of the prior art.
Figure 3:
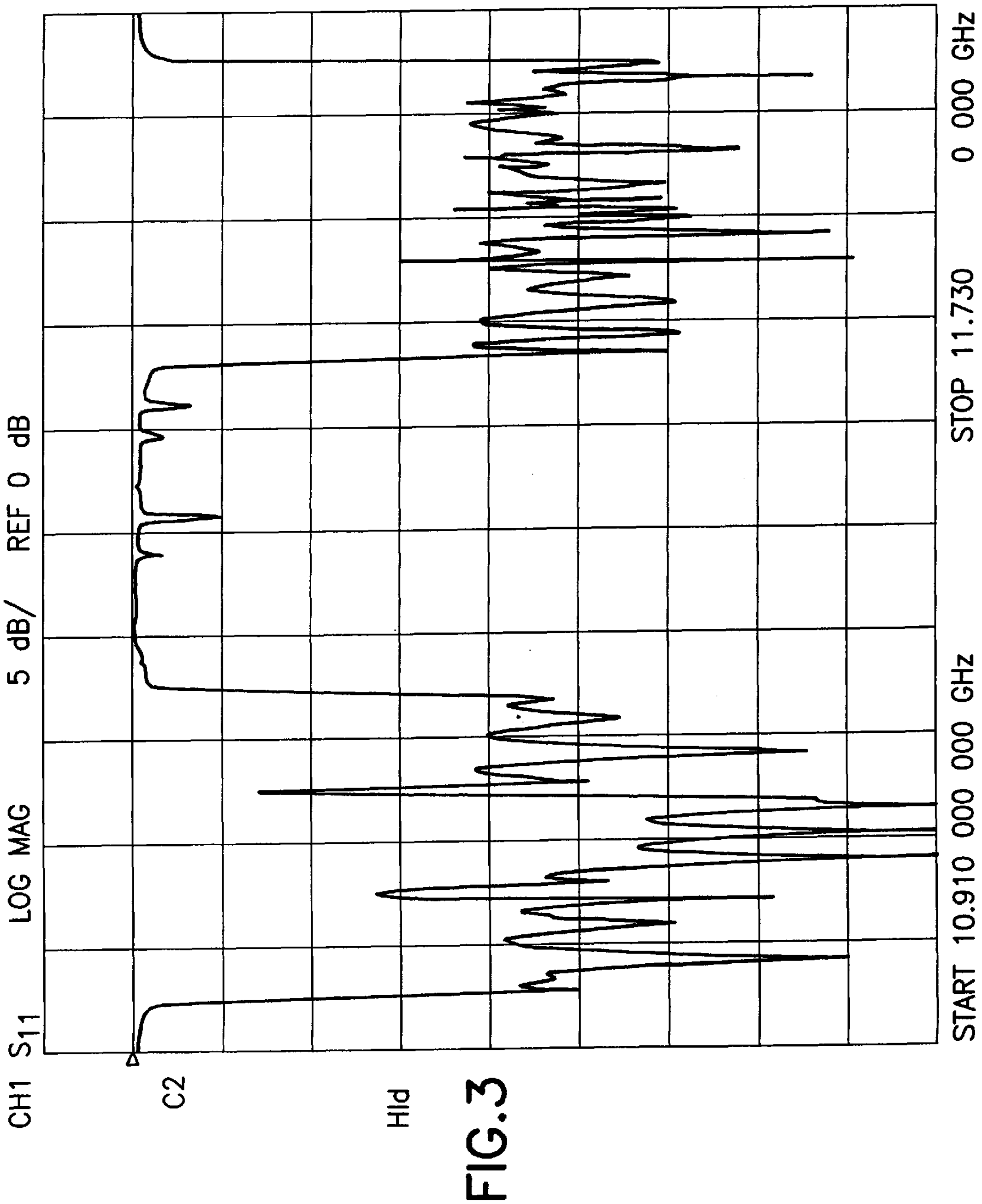
FIG. 3 is a graph illustrating the return loss of a system using the tuning section of the subject invention.

The energy of the microwave signal can be viewed as a charge or current flowing in a rectangular pattern along the interior surface of the walls 11–13 forming cavity 19. The dimple 9, therefore, will modify the impedance of the tuning section 7 and of the overall manifold 5 as well. By trying differing dimple locations along the length of broad wall 11 and testing the resulting performance in a repetitive trial and error process, a final tuning adjustment can be made. This adjustment allows a fine tuning of the multiplexer 1 beyond currently available design methods. A comparison of the graphs of FIGS. 2 and 3 reveals an acceptable level of tuning obtainable in accordance with this invention.

We claim:

1. In a multiplexer for conducting multiple channels of a microwave communications signal having an input section comprising at least one waveguide and filter assembly for receiving and conducting microwave energy, a manifold comprising: an internal chamber connected to the input section for receiving microwave energy from said input section, said manifold constructed with a tuning section coupled to said manifold to form a continuous interior chamber therewith, said tuning section constructed of a deformable material and comprising an exterior wall to permanent deformations are made to alter the impedance of the manifold.

2. In a multiplexer for conducting multiple channels of a microwave communications signal having an input section comprising at least one waveguide and filter assembly for receiving and conducting microwave energy, a manifold as described in claim 1, wherein the permanent deformations are in the form of dimples extending within the internal chamber and impressed along the length of the tuning section.

3. In a multiplexer for conducting multiple channels of a microwave communications signal having an input section comprising at least one waveguide and filter assembly for receiving and conducting microwave energy, a manifold as described in claim 1, wherein the manifold is constructed with a primary section coupled to the input section, said primary section constructed of a light weight composite material and the tuning section is coupled to said primary section.

4. In a multiplexer for conducting multiple channels of a microwave communications signal having an input section comprising at least one waveguide and filter assembly for receiving and conducting microwave energy, a manifold as described in claim 1, wherein the tuning section is constructed of thin wall aluminum.

5. In a multiplexer for conducting multiple channels of a microwave communications signal having an input section comprising at least one waveguide and filter assembly for receiving and conducting microwave energy, a manifold as described in claim 1, wherein the tuning section is coupled to the output of the manifold.

6. A method for tuning a manifold of a multiplex waveguide system constructed to conduct multiple channels of a microwave communications signal within an internal chamber comprising the steps of:

constructing a tuning section of deformable material having an exterior wall enclosing an interior chamber;

coupling said tuning section to the manifold to form a continuous internal chamber therewith;

deforming said exterior wall of said tuning section to alter the impedance of the manifold.

7. A method for tuning a manifold of a multiplex waveguide system constructed to conduct multiple channels of a microwave communications signal within an internal chamber, as described in claim 6, wherein the manifold is constructed of a light weight composite material.

8. A method for tuning a manifold of a multiplex waveguide system constructed to conduct multiple channels of a microwave communications signal within an internal chamber, as described in claim 6, wherein the tuning section is constructed of thin wall aluminum.

9. A method for tuning a manifold of a multiplex waveguide system constructed to conduct multiple channels of a microwave communications signal within an internal chamber, as described in claim 6, wherein the tuning section is deformed by impressing dimples on the exterior wall which project into the internal chamber enclosed thereby.

10. A method for tuning a manifold of a multiplex waveguide system constructed to conduct multiple channels of a microwave communications signal within an internal chamber, as described in claim 6, wherein the tuning section is coupled to the output of the manifold.

* * * * *